(12) United States Patent
James et al.

(10) Patent No.: US 6,538,445 B2
(45) Date of Patent: Mar. 25, 2003

(54) SUPERCONDUCTING CONTROL ELEMENTS FOR RF ANTENNAS

(75) Inventors: Timothy W. James, Goleta, CA (US); Lincoln C. Bourne, Santa Barbara, CA (US)

(73) Assignee: Superconductor Technologies, Inc., Santa Barbara, CA (US)

( * ) Notice: Subject to any disclaimer, the term of this patent is extended or adjusted under 35 U.S.C. 154(b) by 0 days.

(21) Appl. No.: 09/970,842

(22) Filed: Oct. 3, 2001

(65) Prior Publication Data

US 2002/0135373 A1 Sep. 26, 2002

Related U.S. Application Data

(63) Continuation of application No. 07/934,921, filed on Aug. 25, 1992, now Pat. No. 6,335,622.

(51) Int. Cl.[7] .................................................. G01V 3/00
(52) U.S. Cl. ...................................... 324/322; 324/318
(58) Field of Search ................................ 324/300, 318, 324/322, 306, 307; 333/185; 342/1, 4; 505/1, 701, 705

(56) References Cited

U.S. PATENT DOCUMENTS

| | | | |
|---|---|---|---|
| 3,857,114 A | 12/1974 | Minet et al. ................. 333/73 |
| 4,981,838 A | 1/1991 | Whitehead | |
| 5,276,398 A | 8/1992 | Withers | |
| 5,231,078 A | 7/1993 | Riebman et al. | |
| 5,307,068 A * | 4/1994 | Hartemann ................ 333/99 S |
| 5,391,543 A | 2/1995 | Higaki et al. ............... 505/210 |
| 6,347,237 B1 * | 2/2002 | Eden et al. ................. 333/185 |

* cited by examiner

Primary Examiner—Louis Arana
(74) Attorney, Agent, or Firm—O'Melveny & Myers LLP

(57) ABSTRACT

Control elements for RF antennas including high temperature superconducting capacitors, alone or in combination with other elements, including high temperature superconducting films, structures, and applications are formed. In one embodiment a high temperature superconducting capacitor is coupled to an inductor to form a resonant circuit. In another embodiment a high temperature superconducting capacitor is used to make a low-resistance cross-over for an inductor coil. Additional circuits include circuits which do not use non-superconducting materials in the circuit, circuits which have coupled superconducting inductors to provide low-loss signal coupling, tuning and bandwidth broadening, and circuits which include switches to shut off the superconductivity of a superconducting element including low-loss photoconducting and superconducting thermal switches. These circuits may be used to improve Magnetic Resonance Imaging (MRI).

30 Claims, 6 Drawing Sheets

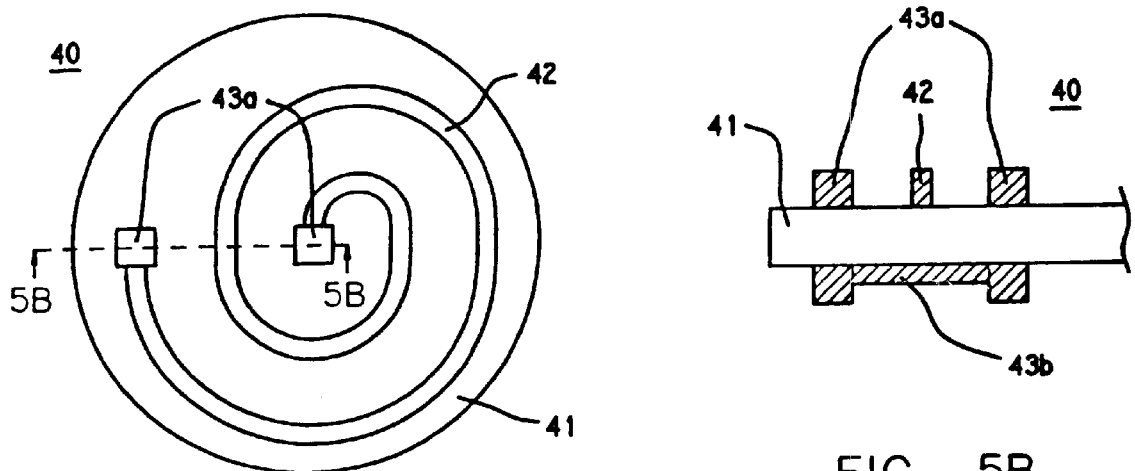
FIG. 5A.
FIG. 5B.
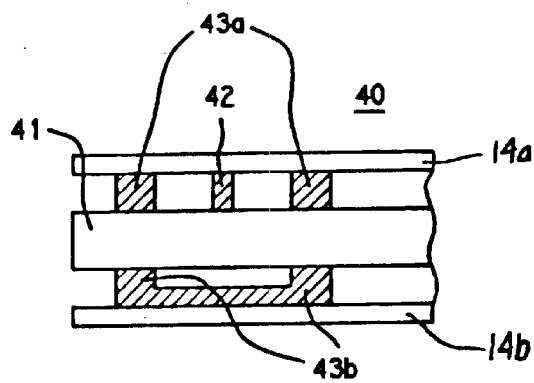
FIG. 5C.
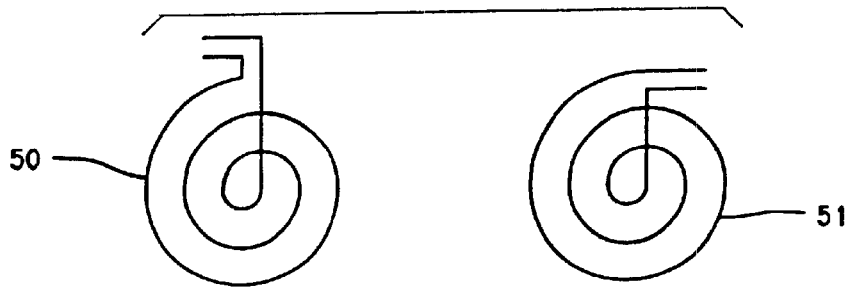
FIG. 6.

SUPERCONDUCTING CONTROL ELEMENTS FOR RF ANTENNAS

RELATED APPLICATION INFORMATION

This application is a continuation of application Ser. No. 07/934,921, filed Aug. 25, 1992, entitled "Superconducting Control Elements for RF Antennas", now U.S. Pat. No. 6,335,622.

FIELD OF THE INVENTION

This invention relates to useful devices from high temperature superconducting materials. Specifically, it relates to circuits having superconducting capacitors and inductors, alone or in combination with other elements made from high temperature superconducting films and, optionally, including low-loss switches. This invention also relates to the use of such circuits to improve Magnetic Resonance Imaging ("MRI").

BACKGROUND OF THE INVENTION

Capacitors are basic building blocks for electronic circuits. Capacitors function principally to store charge or to add reactance to an ac circuit. When combined with other electronic devices, numerous useful circuits may be constructed. For example, when a capacitor is electrically connected to an inductor (an electromagnetic field storage device) a resonant circuit results. Such resonant circuits have numerous applications, such as for an antenna to pick-up radio frequency radiation.

Superconductivity refers to that state of metals and alloys in which the electrical resistivity is zero when the specimen is cooled to a sufficiently low temperature. The temperature at which a specimen undergoes a transition from a state of normal electrical resistivity to a state of superconductivity is known as the critical temperature ("$T_c$").

Until recently, attaining the $T_c$ of known superconducting materials required the use of liquid helium and expensive cooling equipment. However, in 1986 a superconducting material having a $T_c$ of 30K was announced. See, e.g., Bednorz and Muller, Possible High $T_c$ Superconductivity in the Ba—La—Cu—O System, Z. Phys. B-Condensed Matter 64, 189–193 (1986). Since that announcement superconducting materials having higher critical temperatures have been discovered. Collectively these are referred to as high temperature superconductors. Currently, superconducting materials having critical temperatures in excess of the boiling point of liquid nitrogen, 77K at atmospheric pressure, have been disclosed.

Superconducting compounds consisting of combinations of alkaline earth metals and rare earth metals such as barium and yttrium in conjunction with copper (known as "YBCO superconductors") were found to exhibit superconductivity at temperatures above 77K. See, e.g., Wu, et al., Superconductivity at 93K in a New Mixed-Phase Y—Ba—Cu—O Compound System at Ambient Pressure, Phys. Rev. Lett. 58, No. 9, 908–910 (1987). In addition, high temperature superconducting compounds containing bismuth have been disclosed. See, e.g., Maeda, A New High-Tc Oxide Superconductor Without a Rare Earth Element, J. App. Phys. 37, No. 2, L209–210 (1988); and Chu, et al., Superconductivity up to 114K in the Bi—Al—Ca—Br—Cu—O Compound System Without Rare Earth Elements, Phys. Rev. Lett. 60, No. 10, 941–943 (1988). Furthermore, superconducting compounds containing thallium have been discovered to have critical temperatures ranging from 90K to 123K (the highest critical temperatures to date). See, e.g., G. Koren, A. Gupta, and R. J. Baseman, Appl. Phys. Lett. 54, 1920 (1989).

These high temperature superconductors have been prepared in a number of forms. The earliest forms were preparation of bulk materials, which were sufficient to determine the existence of the superconducting state and phases. More recently, thin films on various substrates have been prepared which have proved to be useful for making practical superconducting devices. More particularly, the applicant's assignee has successfully produced thin film thallium superconductors which are epitaxial to the substrate. See, e.g., Olson, et al., Preparation of Superconducting TlCaBaCu Thin Films by Chemical Deposition, Appl. Phys. Lett. 55, No. 2, 189–190 (1989), incorporated herein by reference. Techniques for fabricating and improving thin film thallium superconductors are described in the following patent and copending applications: Olson, et al., U.S. Pat. No. 5,071,830, issued Dec. 10, 1991; Controlled Thallous Oxide Evaporation for Thallium Superconductor Films and Reactor Design, Ser. No. 516,078, filed Apr. 27, 1990; In Situ Growth of Superconducting Films, Ser. No. 598,134, filed Oct. 16, 1990; Passivation Coating for Superconducting Thin Film Device, Ser. No. 697,660, filed May 8, 1991; and Fabrication Process for Low Loss Metallizations on Superconducting Thin Film Devices, Ser. No. 697,960, filed May 8, 1991, all incorporated herein by reference.

High temperature superconducting films are now routinely manufactured with surface resistances significantly below 500 $\mu\Omega$ measured at 10 GHz and 77K. These films may be formed into resonant circuits. Such superconducting films when formed as resonators have an extremely high quality factor ("Q"). The Q of a device is a measure of its lossiness or power dissipation. In theory, a device with zero resistance (i.e. a lossless device) would have a Q of infinity. Superconducting devices manufactured and sold by applicant's assignee routinely achieve a Q in excess of 15,000. This is high in comparison to a Q of several hundred for the best known non-superconducting conductors having similar structure and operating under similar conditions.

Superconducting thin film resonators have the desirable property of having very high energy storage in a relatively small physical space. The superconducting resonators are compact and lightweight. Another benefit of superconductors is that relatively long circuits may be fabricated without introducing significant loss. For example, an inductor coil of a detector circuit made from superconducting material can include more turns than a similar coil made of non-superconducting material without experiencing a significant increase in loss as would the non-superconducting coil. Therefore, the superconducting coil has increased signal pick-up and is much more sensitive than the non-superconducting coil.

Typical resonant circuits are generally limited in their application due to their signal-to-noise ratios ("SNR"). For example, the SNR in a pickup coil of a MRI detector is a limiting factor for low-field MRI systems. Although the low-field MRI systems have a number of advantages over high-field MRI (including cost, site requirements, patient comfort and tissue contrast), they have not yet found widespread use in the U.S. because, in part, of their lower SNR. Resonant circuits made from superconductors improve SNR for low-field human imaging. Therefore, an appropriate superconducting resonant circuit, depending on the field level, coil type, and imaging region, will enable wide-spread use of low-field MRI.

An MRI detector including a low temperature superconducting coil and capacitor has been described. See, e.g., Rollwitz, U.S. Pat. No. 3,764,892, issued Oct. 9, 1973. In addition, resonant circuits for use as MRI detectors which include high temperature superconducting coils and non-superconducting capacitors have been described. See, e.g., Wang, et al., Radio-Frequency Losses of $YBa_2Cu_3O_{7-\delta}$ Composite Superconductors, Supercond. Sci. Technol. 1, 24–26 (1988); High Tc Used in MRI, Supercond. Indus. 20 (Winter 1990); and Hall, et al., Use of High Temperature Superconductor in a Receiver Coil for Magnetic Resonance Imaging, Mag. Res. in Med. 20, 340–343 (1991).

SUMMARY OF THE INVENTION

Resonant circuits made from high temperature superconductors enjoy increased SNR and Q values. The devices of the present application include high temperature superconducting capacitors and inductors having various structures. These capacitors and inductors may be used, for example, in resonant circuits for use in MRI detectors.

The preferred embodiments of superconducting capacitors of the present application comprise high temperature superconducting members separated by a low-loss dielectric and may be an interdigital structure or a plate structure. Applications of these preferred embodiments utilize one or both of these superconducting capacitor structures alone or in combination with other elements which may also be superconducting.

In one embodiment, a superconducting capacitor is fabricated monolithically on the same substrate as is an inductor. The circuit may be completed by connecting gold contact pads. The capacitance can be easily set by scribing away part of the capacitor and can be easily tuned by placing a dielectric or conductor on top of the capacitor. This embodiment may also include an additional superconducting capacitor as a tuning capacitor which can be used to tune the original capacitor either by scribing the tuning capacitor or by positioning a dielectric or conductor on top of it.

Optionally, the signal may be coupled out of the resonant circuit using a superconducting inductor.

In another embodiment, a circuit, which includes an interdigital superconducting capacitor fabricated monolithically on the same substrate as an inductor, is completed by conducting cross-overs which are built over the inductor.

In yet another embodiment, a circuit, which includes a superconducting inductor attached to two superconducting plates, is completed by a second superconductor layer which also has two plates that form capacitors with the plates in the first layer and, thus, complete the circuit without using normal metal. The second layer can be added monolithically, by forming superconducting structures on both sides of a dielectric. The second circuit can also be added by hybridizing together two different superconducting structures, separated by a dielectric.

Accordingly, it is a principal object of this invention to provide high temperature superconducting capacitors.

It is also an object to provide high temperature superconducting capacitors which are tunable.

It is an additional object of this invention to use superconducting capacitors and/or tunable superconducting capacitors in conjunction with inductors to provide circuits which are at least partially superconducting.

It is a further object of this invention to provide circuits with superconducting capacitors and superconducting inductors.

It is another object of this invention to provide resonant circuits which are completed without using normal metal.

It is yet a further object of this invention to provide improved MRI coils with high temperature superconducting components.

It is still an additional object of this invention to provide coupled superconducting inductor coils for improved reception of electronic signals and for low-loss tuning of resonant circuits.

It is also another object of this invention to provide thermal switches for switching superconductor material between superconducting and non-superconducting states.

It is also another object of this invention to provide photoconductive switches to provide low-loss switching in resonant circuits.

BRIEF DESCRIPTION OF THE DRAWINGS

FIG. 5A is a top view of an MRI coil showing an inductor coil and two capacitors.

FIG. 5B is a partial cross-sectional view of the MRI coil of FIG. 5A taken along 5B—5B.

FIG. 5C is a partial cross-sectional view of an MRI coil showing capacitor plates hybridized to a dielectric.

FIG. 6 is a side view of two interacting inductor coils.

DETAILED DESCRIPTION OF THE PREFERRED EMBODIMENTS

Turning to the drawings in more detail, FIGS. 1A and 1B and FIGS. 2A, 2B and 2C show respectively an interdigitated structure and a plate structure of superconducting capacitor 10 of the present invention. As shown, the capacitor 10 comprises two superconducting members 11a and 11b separated by a low loss dielectric 12 (e.g. $LaAlO_3$, MgO, sapphire, or polyimide).

Figure 1A:
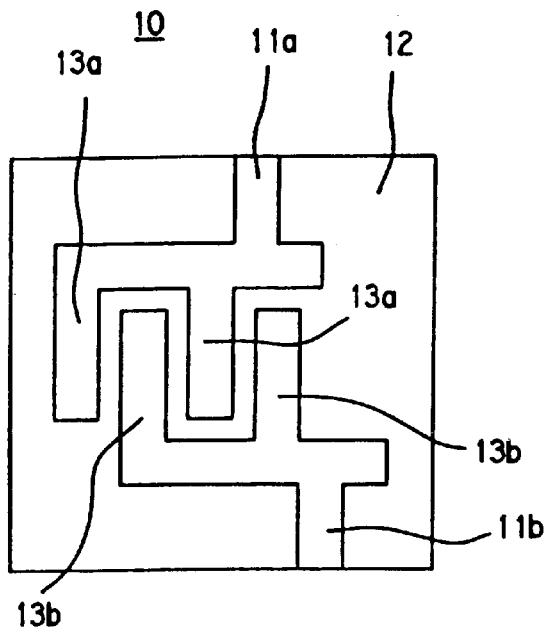
FIG. 1A is a top view of a superconducting capacitor having an interdigitated structure.
Figure 1B:
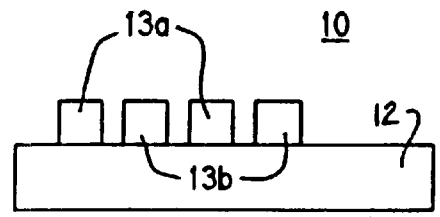
FIG. 1B is a cross-sectional view of the capacitor of FIG. 1A.

The interdigitated structure shown in FIGS. 1A and 1B comprises a capacitor 10 having superconducting members 11a and 11b fabricated monolithically on one side of the same substrate 12. The members 11a and 11b each comprise a plurality of fingers 13a and 13b respectively which extend on the surface of the dielectric substrate 12. The fingers 13a and 13b are positioned on the dielectric 12 such that fingers 13a are interspersed between fingers 13b.

The interdigital superconducting capacitor 10 has the benefit of being easily tuned. It can be tuned either by scribing away part of a superconducting member 11a or 11b or by placing a dielectric or conductor (not shown) on the surface of the capacitor 10.

Figure 2A:
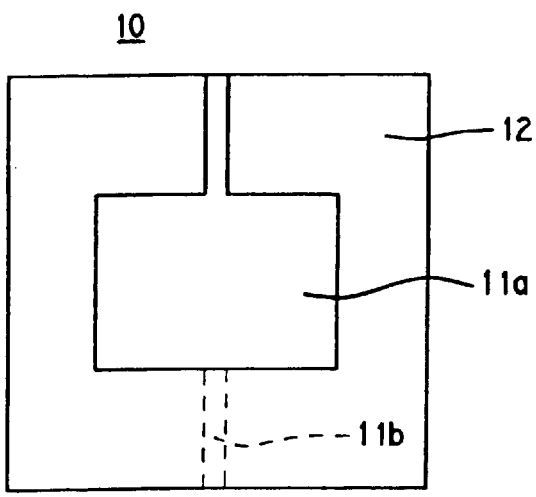
FIG. 2A is a top view of a superconducting capacitor having a plate structure.
Figure 2B:
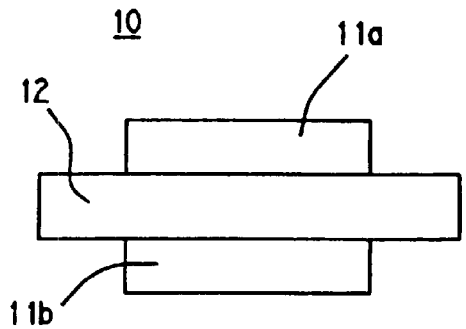
FIG. 2B is a cross-sectional view of the capacitor of FIG. 2A.
Figure 2C:
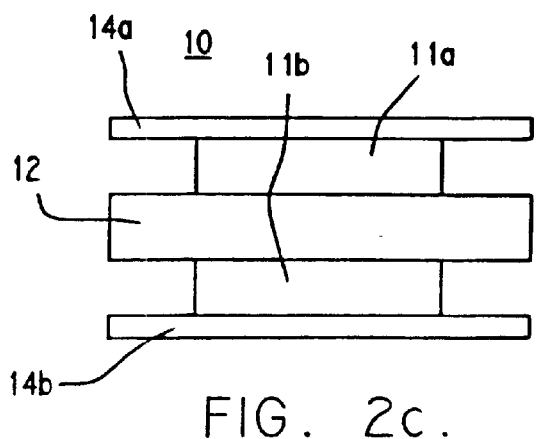
FIG. 2C is a cross-sectional view of a hybrid form of the superconducting capacitor of FIG. 2A.

The plate structure shown in FIGS. 2A, 2B, and 2C comprises a capacitor 10 having superconducting members 11a and 11b on two sides of the same substrate 12. As shown in FIGS. 2B and 2C, the members 11a and 11b each comprise a plate of superconducting material positioned opposite each other on opposite sides of the dielectric 12. As shown in FIG. 2B, the superconducting members 11a and 11b may be fabricated monolithically on opposite sides of the same dielectric substrate 12. As shown in FIG. 2C, the superconducting members 11a and 11b may be fabricated separately on substrates 14a and 14b, respectively, and then hybridized to opposite sides of the same dielectric 12.

Figure 3:
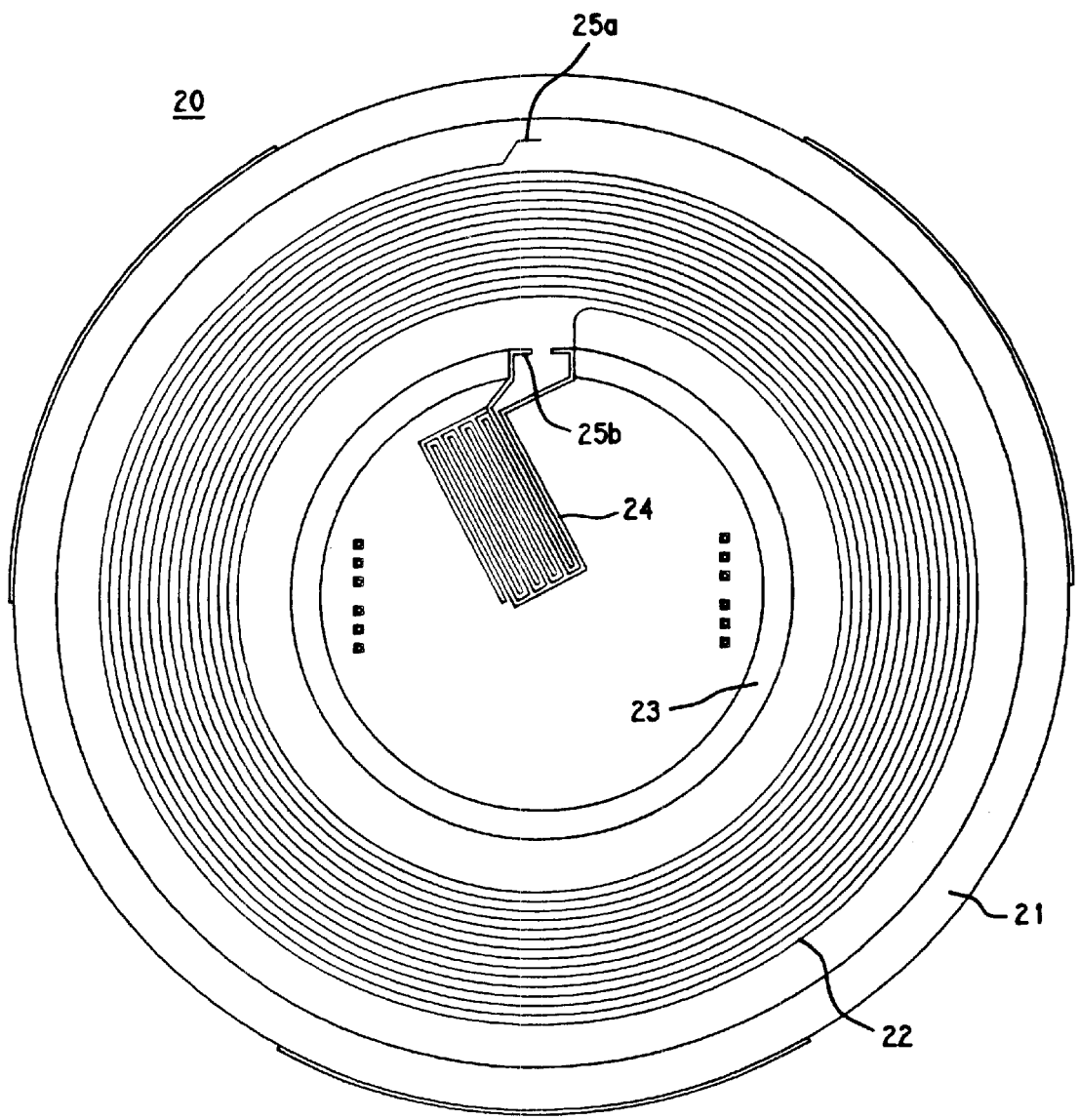
FIG. 3 is a top view of an MRI coil showing an inductor coil, a capacitor, a tuning capacitor, and pads for a cross-over connection.

As described above, one application of the superconducting capacitors 10 of the present invention is incorporation into various resonant circuits. For example, they may be incorporated into resonant circuits for use as MRI detector circuits. FIG. 3 shows a preferred embodiment of an MRI resonant detector circuit 20. This circuit 20 comprises a dielectric substrate 21 upon which the circuit is fabricated, an inductor coil 22 which may be made from superconducting material, a superconducting capacitor 23 having an interdigitated structure, and a superconducting tuning capacitor 24 having an interdigitated structure. The dielectric material used in the present invention preferably comprises an $LaAlO_3$ wafer and the superconducting material used in the present invention preferably comprises an epitaxial thin film thallium based superconductor. Alternative dielectric materials which may be used include magnesium oxide, sapphire, and polyimide. Alternative superconducting materials which may be used include yttrium based or bismuth based superconductors. Any substrate or superconductor consistent with the structure and functionality of this invention may be used.

The dielectric substrate 21 comprises a two inch wafer (approximately 20 mils thick) upon which a superconducting film is patterned to form the circuit 20. The inductor coil 22 is a fifteen turn inductor coil with a line width of $200\mu$, a pitch of $400\mu$ (i.e. a spacing of $200\mu$ between each line), and a total line length of 175.3 cm. The inductor coil 22 has a mean radius of 1.86 cm, an outer diameter of 4.3 cm, and an inner diameter of 3.14 cm.

The superconducting capacitor 23 comprises an interdigital structure having a total of twenty-one interspersed tines each having a line width of $50\mu$ and a pitch of $75\mu$ (i.e. a spacing of $25\mu$ between each tine).

To trim or set the capacitance of the capacitor 23, the tines of the capacitor 23 may be cut or a dielectric or conductor may be placed on its surface. The capacitor 23 has a mean radius of 1.3 cm and an outer diameter of 2.8 cm.

The tuning capacitor 24 comprises an interdigital structure having a total of ten interlocking tines each having a line width of $200\mu$ and a pitch of $400\mu$ (i.e. a spacing of $200\mu$ between each tine). The tuning capacitor 24 allows for dynamic tuning (i.e. tuning during operation) by sliding a dielectric or conductor across its surface.

In addition, gold contact pads may be provided on the ends 25a and 25b of the inductor coil 22 and the superconducting capacitor 23 respectively for providing points at which the circuit may be completed. It is highly desirable to keep the contact resistance to a minimum. Placing the gold on the superconductor and annealing it helps improve the bond between the gold and the superconductor. In addition, placing the gold on the superconductor prior to placing photo-resist on the superconductor helps reduce the contact resistance. See copending application Fabrication Process for Low Loss Metallizations on Superconducting Thin Film Devices, Ser. No. 697,960, filed May 8, 1991, assigned to a common assignee, incorporated herein by reference. Other techniques to reduce contact resistance, such as annealing, may be advantageously employed.

For example, a hybrid high temperature superconductor crossover comprising a line of high temperature superconductor film patterned and diced from a separate dielectric wafer and having gold contact pads may be glued on the coil surface and the gold contact pads of the crossover may be connected to the gold contact pads of the circuit with gold wire-bonds thereby connecting the inductor 22 and capacitor 23 in a parallel RLC configuration. This arrangement has the benefit of minimizing the amount of normal metal (as opposed to superconducting metal) required for the crossovers. Additional steps may be taken to minimize the amount of normal metal used in these circuits including using indium bumps to connect the circuit to another coil. In the indium bump configuration a superconducting crossover, as described above, is flipped over and its pads are electrically connected to the pads on the circuit using indium bumps.

Figure 4:
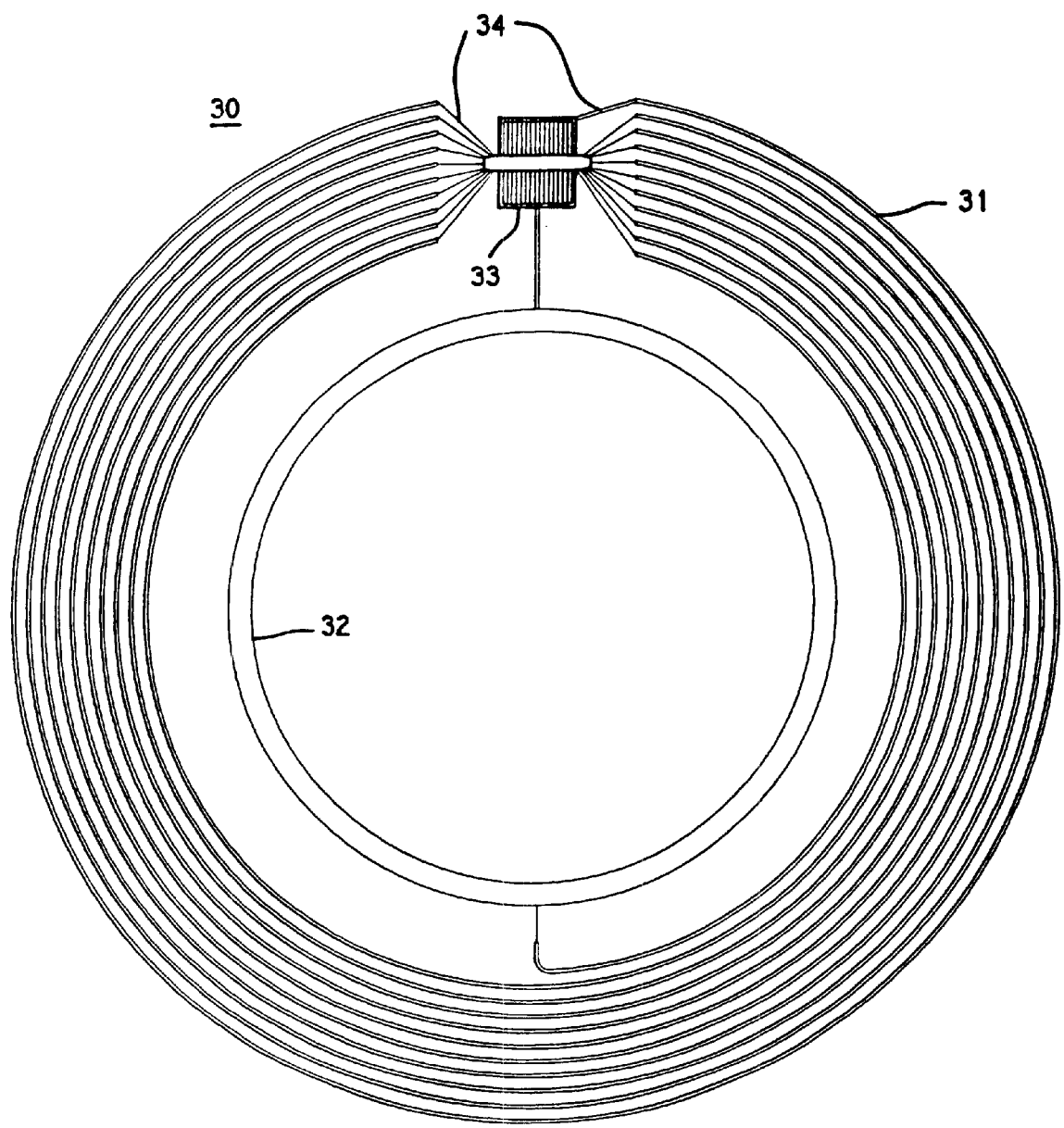
FIG. 4 is a top view of an MRI coil showing an inductor coil, a capacitor, and pads for a cross-over connection.

FIG. 4 shows a second resonant circuit 30 having an inductor coil 31, an interdigitated superconductor capacitor 32, and pads 33 for connecting cross-overs. This circuit 30 differs from the circuit 20 described above in that the lines of the inductor coil 31 are configured to provide an area 34 on the inductor where the width of the inductor is narrowed. This narrowed width is beneficial because it provides for shorter and, therefore, less resistive crossovers.

The crossovers of the resonant circuits of the present invention are resistive and, therefore, lossy because of the normal metal used to complete the circuits (e.g. gold contact pads). The less normal metal used in these circuits, the less loss the circuit experiences (i.e. the higher the efficiency of the circuit). By narrowing the width over which the crossovers must span, one can minimize the length of the crossovers and thereby provide for more efficient crossovers. The circuit shown in FIG. 4 shows a circuit embodying these principles.

FIGS. 5A and 5B show a third resonant circuit 40 having a superconductor capacitor of the present invention. The circuit 40 shown comprises a dielectric substrate 41, an inductor coil 42, two upper superconducting plates 43a, and two lower superconducting plates 43b. The plates couple through the dielectric to form two capacitors which complete the circuit by crossing over the inductor without using normal metal. Thus, a high-Q resonant structure can be formed from a two-sided film (as shown in FIGS. 5A and 5B). This same result could be achieved by using a hybrid structure where the inductor 42 and plates 43a comprise one high temperature superconducting film and the plates 43b comprise a second high temperature superconducting film which are held near each other separated by a low loss dielectric 41 (as shown in FIG. 5C). These configurations provide circuits which do not incorporate any non-superconducting materials and, therefore, do not experience loss due to use of non-superconducting materials.

FIG. 6 shows an application of superconducting inductor coils. A superconducting inductor may be magnetically coupled to the inductor of a resonant coil and, thus, allow for tuning and for signal detection without the use of lossy normal metal wires. Magnetic flux links both coils and causes them to interact. If both coils are superconducting, the structure gives coupling and tuning with low loss (i.e. high Q). In addition, the band-width of the coils can be changed by changing the geometry (e.g. the spacing and the number of turns) between the two (i.e. by changing the mutual inductance). Low-loss resonant circuits have high Qs and are, thus, sensitive only to narrow signal bandwidths. In some applications it will be important to detect a given bandwidth with very low loss; the method of coupled superconducting inductors described above is one way to achieve a desired bandwidth with low loss.

In an application, as shown in FIG. 6, a first coil 50, a resonant coil, which may be a part of an MRI detector coil and a second coil 51, a simple inductor, are provided. The second coil 51 tunes the detector coil 50 and provides means for bringing out the signal from the detector coil 50 without soldering wires to it.

In addition, the circuits described may include various switching devices to "de-Q" or shut off the superconducting capability of the circuit or an element of the circuit, or to shift the resonant frequency of the circuit. For example, a thermal switch could be used. A thermal switch de-Qs a superconductor by heating the superconductor at one or more points to a temperature above its $T_c$. Once heated above its $T_c$, the superconductor loses its superconductivity. By heating a sufficient amount of the circuit above $T_c$, the resistance of the circuit can be increased enough to sufficiently de-Q the resonance.

Figure 7A:
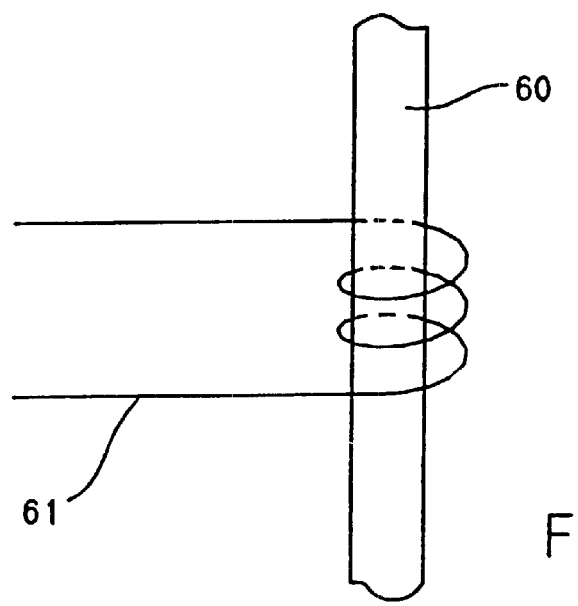
FIG. 7A is a top view of a resistive control line thermal switch.
Figure 7B:
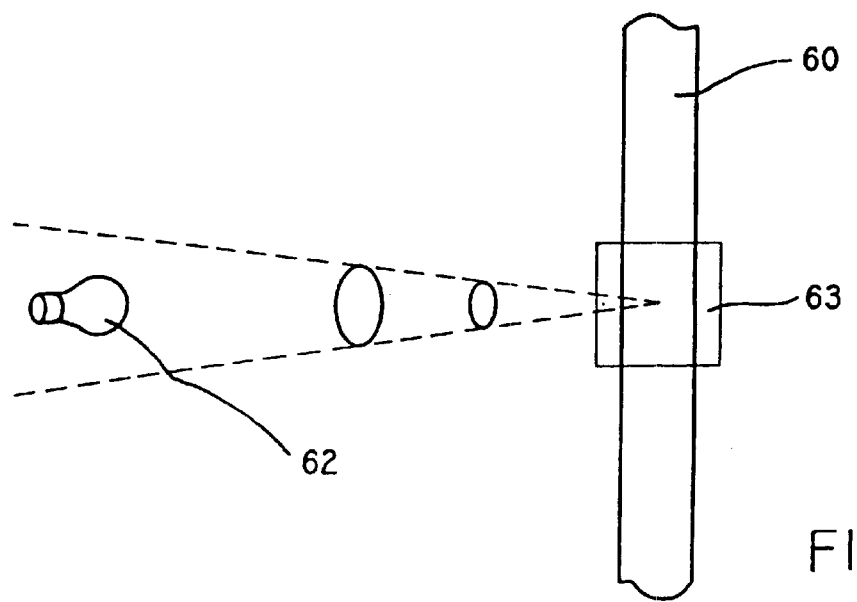
FIG. 7B is a top view of a focussed light source thermal switch.

FIGS. 7A and 7B show two embodiments of thermal switches. As shown in FIG. 7A, a resistive control line 61 is placed near a line of superconducting material 60. Running current through the resistive control line 61 causes it to heat up. As the resistive control line 61 heats up, some of the heat is transferred to the superconducting material 60 which then is heated to a temperature above its $T_c$. FIG. 7B shows a thermal switch where the heat source is a light source 62 which is then focussed on a particular area 63 of a superconducting material 60. Once the superconducting material 60 is heated above its $T_c$, the material is no longer superconducting.

Figure 8A:
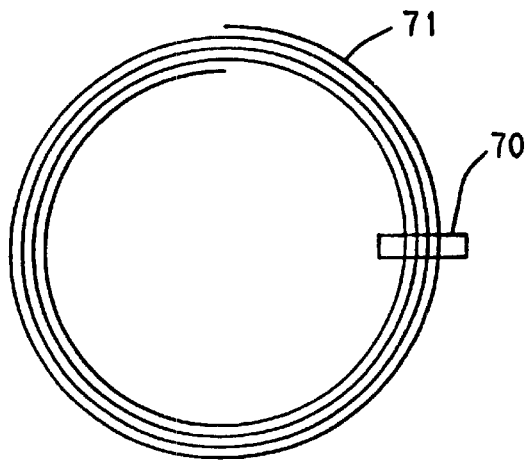
FIG. 8A is a top view of a photoconductor switch system for short circuiting an inductor.
Figure 8B:
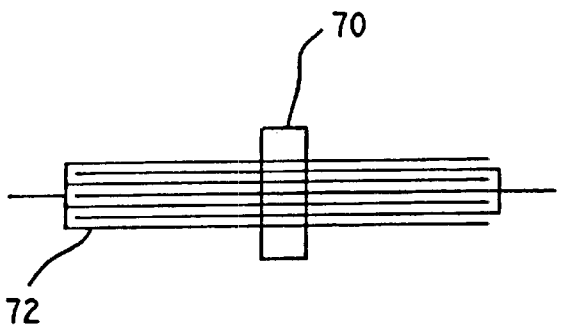
FIG. 8B is a top view of a photoconductor switch system for short circuiting a capacitor.
Figure 8C:
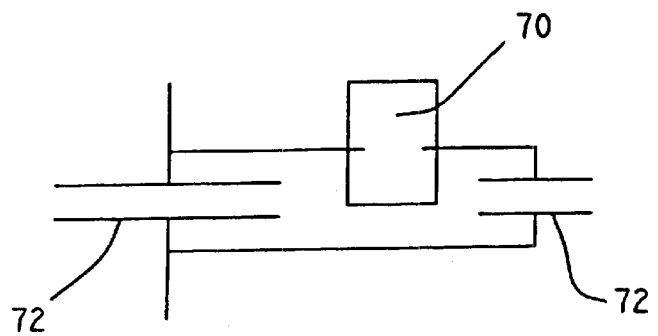
FIG. 8C is a top view of a photoconductor switch system for adding capacitance to a circuit.

Another switch, shown in FIGS. 8A, 8B, and 8C, uses a photoconductor 70 which is switched between conducting and non-conducting states by exposing it to light. The photoconductor 70, for example, can be positioned on or near a superconducting inductor 71 or a superconducting capacitor 72 such that when the photoconductor 70 is in a conducting state it de-Qs the resonant circuit by shorting out the inductor 71 or capacitor 72 (see FIGS. 8A and 8B) or by adding inductance or capacitance (see FIG. 8C). Alternatively, the configurations in FIGS. 8A and 8B could be implemented with a photoconductor switch that is lossy when exposed to light and in this way de-Qs the circuit. See, e.g., Sun, et al., Active Superconducting Devices, filed Jun. 24, 1991, and incorporated herein by reference.

An additional switch technique relies on heat generated by an RF transmit pulse to switch a superconductor in a circuit out of a superconducting state. If a superconducting inductor receives enough RF energy from a transmit pulse, the resultant electrical current will exceed the superconducting critical current at one or more points in the circuit. The material at these points will be heated above the critical temperature and will, therefore, become much more resistive. This increase in resistance will limit the RF power absorbed by the inductor. The switching on-to-off and off-to-on times should occur on a time-scale of microseconds, fast enough to limit absorption from the transmit pulse, while recovering in time to receive the RF signal. The circuit can include one or more of these switches by designing points with reduced critical current, e.g. by narrowing the line-width or by damaging the superconductor within a restricted area.

Other techniques to, for example, raise the temperature of a superconductor above its $T_c$ or to add capacitance or inductance may be advantageously employed.

Test Data

Several high temperature superconducting coils ("HTS coils"), as shown in FIG. 3 and described above, having resonant frequencies near 2.74 MHz were manufactured and tested.

One of the HTS coils was designed to be soldered onto a standard Toshiba electronic control board for MRI coils. The transition from wire-bonds to solder pads was made by coating small $LaAlO_3$ pieces with gold. These pieces were glued on the edge of the coil, and contacts to both ends of the inductor were made with HTS crossovers and wire-bonds.

Two HTS inductors were also fabricated and attached to BNC cables. These inductors were used to inductively couple to the HTS resonant coils, thus tuning the coils and allowing for signal detection without the need to solder wires to the resonant coil.

A set of dewar assemblies was also designed and fabricated. The nonmetallic dewars allowed the HTS coils to be held in a liquid nitrogen bath, separated from a room-temperature sample by a few millimeters. The dewar assemblies were designed either for inductive coupling or soldering to the Toshiba electronics board. In the inductive coupling mode, an HTS inductor could be held rigidly at any desired distance from the resonant HTS coil. A sliding mechanism with a $LaAlO_3$ piece was attached to the resonant coil to vary the capacitance of the tuning capacitor in the liquid nitrogen bath. Additional $LaAlO_3$ holders could be added to press $LaAlO_3$ pieces against the main capacitor. The resonant coil could also be coupled to the Toshiba electronics board by attaching the board to the dewar assembly and soldering wires from the board to the wire-bond/solder transition pads.

Imaging experiments were carried out. Coil #2L1256 was mounted in the inductive coupling mode and had a measured Q of approximately 1,160. An image was made of an oil phantom (a loss-less test sample) and compared to an image made by a similar copper coil (Q≈450) which was also inductively coupled. The HTS coil gave a better signal-to-noise ratio (SNR) of roughly sixty percent.

Coil #2L1349 was attached to the Toshiba electronics board. Before attaching the board the coil Q value was approximately equal to 1,900. The addition of the board lowered the Q value to about 1,200. Placing the coil in the magnetic field of the MRI machine (640 Gauss) lowered the Q by a very small amount. In comparison to a similar copper coil, also attached to an electronics board and cooled in liquid nitrogen, the HTS coil gave an improvement in SNR of about sixty percent for an oil phantom, thirty percent for a saline phantom, and thirty percent for a human wrist. This is a significant increase in performance.

Images were also made using a room temperature copper coil (Q≈190) soldered to the electronics board and pressed directly against a saline phantom and a human hand. Because of the insulation thickness, the HTS coil was further from the body, giving it a disadvantage in SNR when compared to the warm copper coil. For the HTS coil on the Toshiba electronics board, the SNR at the surface of the body was 20% lower than the warm copper coil. However, the effect of the insulation spacing is reduced with increasing distance into the body, and at a depth of 2 inches the HTS coil had a 50% advantage in SNR over the warm copper coil. The insulation thickness will be even less important for larger diameter coils, and we also anticipate that thinner insulation layers will be used in future dewar designs.

Coil #2L1335 was mounted in an inductive coupling mode. The measured Q was about 3,000, but the images had dark bands characteristic of spin over-flipping, and a good measurement of SNR was not available. The resonant coil and the main RF transmission coil were not completely decoupled. This problem can be easily remedied with, for example, a decoupling switch or de-Qing switch as previously described.

HTS coils as shown in FIG. 4 and described above were also tested. These coils exhibited Q values of up to 8,260 at 5.8 MHz.

Although the invention has been described with respect to specific preferred embodiments, many variations and modifications may become apparent to those skilled in the art. It is therefore the intention that the appended claims be interpreted as broadly as possible in view of the prior art to include all such variations and modifications.

What is claimed is:

1. A method for tuning a resonant circuit including high temperature superconducting components comprising the steps of:
    fabricating a resonant circuit, including high temperature superconducting material on a substrate, having both capacitance and inductance; and
    scribing the resonant circuit so as to affect the characteristics of the resonant circuit.

2. The method according to claim 1, wherein the high temperature superconducting material is a thallium-based superconductor.

3. The method according to claim 1, wherein the high temperature superconducting material is a yttrium-based material.

4. The method according to claim 1, wherein the high temperature superconducting material is a bismuth-based material.

5. The method according to claim 1, wherein the step of scribing produces dynamic tuning of the resonant circuit.

6. The method according to claim 1, wherein the high temperature superconducting material comprises an epitaxial thin film superconductor.

7. The method according to claim 1, wherein the substrate comprises a dielectric wafer.

8. The method according to claim 7, wherein the dielectric wafer is equal to or less than 2 inches in diameter.

9. The method according to claim 1, wherein the resonant circuit comprises a high temperature superconducting capacitor coupled to a high temperature superconducting inductor.

10. The method according to claim 9, wherein the high temperature superconducting capacitor is fabricated monolithically on the same substrate as is the high temperature superconducting inductor.

11. The method according to claim 1, wherein the resonant circuit is used to pick-up radio frequency radiation.

12. A method of tuning a high temperature superconducting resonator comprising the steps of:
    providing a substrate having a planar surface;
    providing a high temperature superconducting inductor on the planar surface of the substrate;
    providing a high temperature superconducting capacitor on the planar surface of the substrate, the capacitor being electrically connected to the high temperature superconducting inductor;
    providing a tuning body adjacent to the planar surface; and
    altering the relative position of the tuning body and the planar surface so as to tune the resonator.

13. The method according to claim 12, wherein the tuning body is a dielectric.

14. The method according to claim 12, wherein the tuning body is a conductor.

15. The method according to claim 12, wherein the step of altering the relative position of the tuning body and the planar surface produces dynamic tuning of the resonator.

16. The method according to claim 12, wherein the high temperature superconducting capacitor has an interdigitated structure.

17. The method according to claim 12, wherein the high temperature superconducting inductor and the high temperature superconducting capacitor comprise an epitaxial thin film superconductor.

18. The method according to claim 12, wherein the substrate comprises a dielectric wafer.

19. The method according to claim 18, wherein the dielectric wafer is equal to or less than 2 inches in diameter.

20. The method according to claim 12, wherein the high temperature superconducting capacitor is fabricated monolithically on the same substrate as is the high temperature superconducting inductor.

21. A method of tuning a high temperature superconducting resonator comprising the steps of:
    providing a substrate having a planar surface;
    providing a high temperature superconducting resonator patterned from a high temperature superconducting thin film;
    providing a tuning body adjacent to the planar surface; and
    dynamically altering the relative position of the tuning body and the planar surface so as to tune the high temperature superconducting resonator.

22. The method according to claim 21, wherein the tuning body is a dielectric.

23. The method according to claim 21, wherein the tuning body is a conductor.

24. The method according to claim 21, wherein the high temperature superconducting resonator comprises an epitaxial thin film superconductor.

25. The method according to claim 21, wherein the substrate comprises a dielectric wafer.

26. The method according to claim 25, wherein the dielectric wafer is equal to or less than 2 inches in diameter.

27. The method according to claim 21, wherein the high temperature superconducting thin film is thallium-based.

28. The method according to claim 21, wherein the high temperature superconducting thin film is yttrium-based.

29. The method according to claim 21, wherein the high temperature superconducting thin film is bismuth-based.

30. A method of tuning magnetically coupled high temperature superconducting resonators comprising the steps of:
    providing a first high temperature superconducting resonator;
    providing a second high temperature superconducting resonator in proximity to the first high temperature superconducting resonator so as to magnetically link the first high temperature superconducting resonator to the second high temperature superconducting resonator; and
    tuning one of the first and second high temperature superconducting resonators.

* * * * *